United States Patent [19]

Iyer et al.

[11] Patent Number: 5,733,816
[45] Date of Patent: Mar. 31, 1998

[54] METHOD FOR DEPOSITING A TUNGSTEN LAYER ON SILICON

[75] Inventors: Ravi Iyer; Irina Vasilyeva, both of Boise, Id.

[73] Assignee: Micron Technology, Inc., Boise, Id.

[21] Appl. No.: 572,164

[22] Filed: Dec. 13, 1995

[51] Int. Cl.⁶ .................................................. H01L 21/28
[52] U.S. Cl. ........................... 438/592; 438/643; 438/648; 438/653; 438/656
[58] Field of Search .............................. 437/190, 192, 437/193, 246; 438/592, 643, 648, 653, 656

[56] References Cited

U.S. PATENT DOCUMENTS

| | | | |
|---|---|---|---|
| 4,545,116 | 10/1985 | Lau | 437/202 |
| 4,847,111 | 7/1989 | Chow et al. | 437/200 |
| 5,034,348 | 7/1991 | Hartswick et al. | 437/192 |
| 5,204,286 | 4/1993 | Doan | 437/192 |
| 5,227,334 | 7/1993 | Sandhu | 437/190 |
| 5,246,881 | 9/1993 | Sandhu et al. | 437/190 |
| 5,300,455 | 4/1994 | Willermoz et al. | 437/190 |
| 5,364,803 | 11/1994 | Luv et al. | 437/200 |
| 5,393,565 | 2/1995 | Suzuki et al. | 437/200 |

FOREIGN PATENT DOCUMENTS

| | | |
|---|---|---|
| 02114641 | 4/1990 | Japan . |

OTHER PUBLICATIONS

Danek et al, "Resitivity reduction and chemical stabilization of organometallic chemical vapor deposited titanium nitride by nitrogen of plasma", App. Phys. Lett. vol.68, No. 7, pp. 1015–1016, Feb. 12, 1996 (abstract).

*Primary Examiner*—John Niebling
*Assistant Examiner*—Thomas G. Bilodeau
*Attorney, Agent, or Firm*—Fillmore, Belliston & Israelsen; Angus C. Fox, III

[57] ABSTRACT

This invention is a process for depositing tungsten metal on a silicon surface with the deposited layer having improved uniformity of thickness over prior art deposition techniques. The process involves the steps of removing any native silicon dioxide present on the silicon surface, forming a barrier layer which overlies the silicon surface which prevents the upward diffusion of silicon atoms from the polycrystalline surface, and depositing a final tungsten metal layer on top of the barrier layer. The barrier layer is preferably a refractory metal nitride. It may be formed directly by chemical vapor deposition, by reactive sputtering, or it may be formed indirectly by depositing a preliminary tungsten metal layer, subjecting the preliminary layer to a plasma formed from $NH_3$ and $N_2$ gases. Both preliminary and final tungsten metal layers are deposited preferably via chemical vapor deposition using the $WF_6$ and $SiH_4$ as reactants.

19 Claims, 3 Drawing Sheets

METHOD FOR DEPOSITING A TUNGSTEN LAYER ON SILICON

FIELD OF THE INVENTION

This invention relates to methods for depositing a tungsten layer on silicon in an integrated circuit and, more particularly, to methods for forming barrier layers between the tungsten and the silicon which prevent interaction between the tungsten and the underlying silicon.

BACKGROUND OF THE INVENTION

In the manufacture of integrated circuits, both field-effect transistor gate electrodes and gate electrode interconnects are typically etched from a uniformly-thick conductive layer that blankets the in-process circuitry. In semiconductor memory circuits, word lines which are formed from a uniformly-thick conductive layer which blankets the circuitry form both gate electrodes and gate interconnects. Wherever a word line passes over a field oxide region, it functions as a gate electrode interconnect; wherever it passes over a gate dielectric layer that overlies an active area, it functions as a gate electrode. In typical circuits, whether they be memory circuits, processor circuits or logic circuits, multiple gate electrodes are series coupled by intervening gate interconnects. In other words, the gate electrode/gate interconnect structures seen in memory circuits closely resemble those found in other types of integrated circuits.

For early generations of integrated circuits, gate electrodes and gate interconnects were typically etched from a heavily-doped polycrystalline silicon ("polysilicon") layer. However, in order to achieve increased operational speeds and lower stack heights in subsequent generations of circuits, it became necessary to decrease the, sheet resistance of the conductive layer from which the gates and interconnects were formed.

A significant improvement in the conductivity of gate electrodes and gate interconnects was realized by forming a low-resistance metal silicide layer on top of the electrode/interconnect layer. A silicide is a binary compound formed by the reaction of a metal and silicon at elevated temperature. As integrated circuit processing generally requires a series of elevated temperature steps, metals having high melting points are preferred for structures, such as gates, which are created early in the fabrication process. A metal layer applied at the end of the fabrication process need not possess a particularly high melting point. Thus, aluminum, which has a melting point of only 660° C., is typically used only for upper level interconnect lines, and is applied to the circuitry only after no further processing of the wafer in excess of about 600° C. is required. The group of refractory metals is generally considered to include tungsten (melting point 3410° C.), titanium (m.p. 1675° C.), platinum (m.p. 1774° C.), paladium (m.p. 1549° C.), cobalt (m.p. 1495° C.), molybdenum (m.p. 2620° C.), nickel (m.p. 1455° C.), rhodium 1966° C.) and iridium (m.p. 2454° C.). Because of considerations related to cost and ease of deposition, silicides of tungsten and titanium are the most widely used for integrated circuit applications. Generally, a metal silicide conductive layer within an integrated circuit is formed by one of three methods. The first method involves depositing (usually by reactive sputtering) a metal silicide layer on top of a previously deposited polysilicon layer and annealing the resulting stack to break up the native oxide layer on the surface of the polysilicon layer (which enhances adhesion of the silicide layer to the polysilicon layer and also ensures adequate electrical interconnection between the two layers).

The second method of forming a metal silicide conductive layer involves depositing a metal layer (by either reactive sputtering or by chemical vapor deposition) on top of a previously deposited polysilicon layer and annealing the resulting stack to react the metal layer with a portion of the polysilicon layer (which, of course, also eliminates the native oxide layer on the polysilicon). The third method of forming a metal silicide conductive layer involves chemical vapor deposition using tungsten hexafluoride in combination with either silane or dichlorosilane. During the deposition process, the ratio of ratio of silane or dichlorosilane to tungsten hexafluoride must be maintained within a range of 10:1–200:1 to prevent the deposition of tungsten metal. Although metal silicides have significantly higher conductivity than heavily-doped silicon, a silicide is about an order of magnitude more resistive than the pure metal from which it is formed.

In the quest of faster operation speeds (required for high-speed processor and memory circuits) and reduced stack heights (in the interest of enhanced planarity and, thus, better photolithograhic resolution over the entire circuit), integrated circuit manufacturers are investigating the use of pure metal layers to enhance the conductivity of polysilicon transistor gates and gate interconnects. Tungsten is of particular interest because it is relatively inexpensive, has a very high melting point, and is known to be compatible with current circuit manufacturing processes. However, the deposition of tungsten metal on silicon results in tungsten layers having poor thickness uniformity. As there is considerable interest in employing a tungsten metal layer to reduce word line resistance, the conductive layers in the various drawings which respectively illustrate the prior art and the present invention have been deposited over gate oxide and field oxide layers. Referring to FIG. 1, in one experiment characteristic of prior art technology, a semiconductor substrate 11 was subjected to an oxidizing environment to form field oxide layer regions 13 and gate oxide layer regions 12. Prior to formation of the field oxide layer regions, an implant step was performed that created channel-stop regions 17 beneath the field oxide regions 13. Following the formation of oxide layer regions 12 and 13, a deposition step was employed to form a polycrystalline silicon ("polysilicon") layer 14 superjacent the oxide layers 12 and 13. A subsequent deposition step was employed to form a tungsten layer 15 superjacent the polysilicon layer 14. The tungsten layer 15 was deposited via chemical vapor deposition by reacting $WF_6$ (tungsten hexafluoride) with $SiH_4$ (silane). Prior to the deposition step, native oxide was removed in-situ from the upper surface of the polysilicon layer 14 with a fluorine-based plasma etch. Alternatively, a wet etch can be employed to remove the native oxide from the surface of the polysilicon if the wafer can be moved to the deposition chamber without exposure to oxygen. The tungsten deposition reaction was carried out for 80 seconds at a pressure of 4.5 torr, at a temperature of 450° C., and with a ratio of $SiH_4$ to $WF_6$ of 0.5:1. The deposited tungsten layer 15 had 28% (1 sigma) uniformity. Deposited layers having such poor uniformity of thickness characteristics are unacceptable for use in integrated circuits. It is hypothesized that the high degree of non-uniformity observed may be related to the uneven adsorbtion of $SiH_4$ gas on the surface of the polysilicon layer. In regions where few $SiH_4$ gas molecules are adsorbed, tungsten $WF_6$ molecules attack the polysilicon layer to form tungsten silicide.

There is a need for an improved method of depositing tungsten metal layers on silicon surfaces. Metal layers deposited using the improved method will have greater uniformity of thickness than is achievable using prior art methods.

SUMMARY OF THE INVENTION

This invention is a process for depositing tungsten metal on a silicon surface with the deposited layer having improved uniformity of thickness over prior art deposition techniques. The process involves the steps of removing any native silicon dioxide present on the silicon surface, forming a barrier layer which overlies the silicon surface which prevents the upward diffusion of silicon atoms from the underlying silicon surface, and depositing a final tungsten metal layer on top of the barrier layer. The barrier layer is preferably a refractory metal nitride. It may be also be formed directly by reactive sputtering, chemical vapor deposition, or indirectly by depositing a preliminary tungsten metal layer and, then, subjecting the preliminary layer to a plasma formed from $NH_3$ and $N_2$ gases. Both preliminary and final tungsten metal layers are deposited preferably via chemical vapor deposition using the $WF_6$ and $SiH_4$ as reactants.

DETAILED DESCRIPTION OF THE PREFERRED EMBODIMENT

Figure 1:
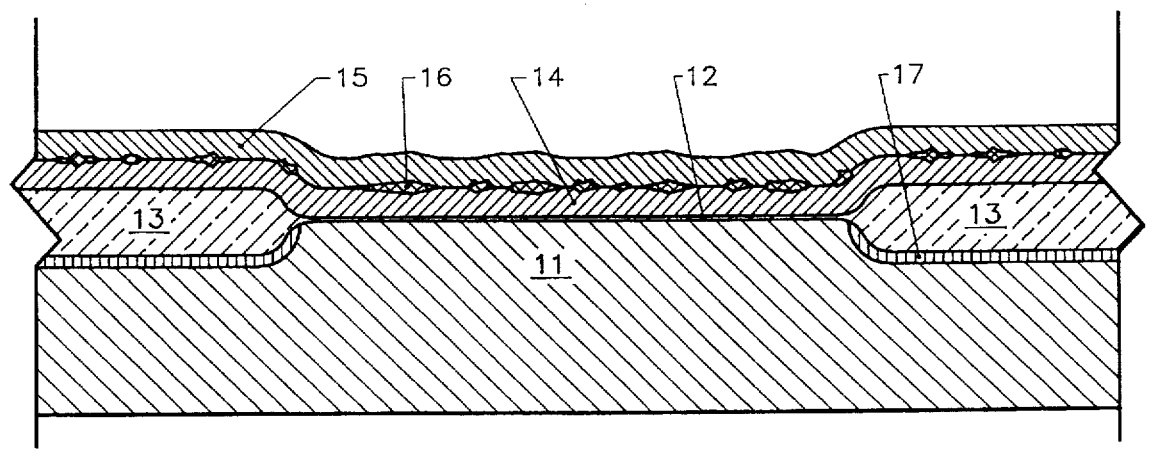
FIG. 1 is a cross-sectional view of a portion of a semiconductor substrate which, in accordance with prior art techniques, has been subjected to multiple oxidation steps, a polysilicon deposition step and a tungsten deposition step.
Figure 2:
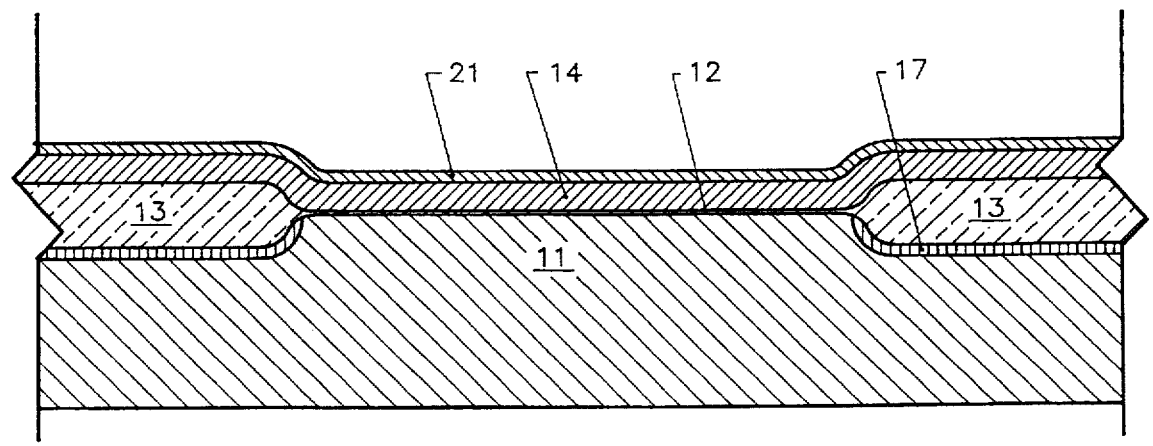
FIG. 2 is a cross-sectional view of a portion of a semiconductor substrate having both field oxide and gate oxide layer regions on which, in accordance with a first embodiment of the invention, a polysilicon layer and a preliminary tungsten layer have been deposited in succession.

As there is considerable interest in employing a tungsten metal layer to reduce word line resistance, the invention is described in the context of formation of a tungsten layer superjacent a polycrystalline silicon ("polysilicon") layer. This is deemed to be the preferred multi-layer structure for word lines. Thus, as shown in FIG. 2 (the starting point for a first embodiment process of the invention) and in FIG. 5 (the starting point for a second embodiment process of the invention), the upper surface of a silicon substrate 11 is thermally oxidized to form both a field oxide layer 13 and a gate oxide layer 12. In addition, for both FIGS. 1 and 2, a polysilicon layer 14 is deposited superjacent oxide layers 12 and 13. Nevertheless, the invention should not be considered to be limited to word line applications, nor should it be considered to be limited to tungsten on polysilicon applications, as it may be applied equally well to other types of conductive lines utilized in integrated circuits and to tungsten on single-crystal silicon applications.

As shown in FIG. 2, a further deposition step forms a preliminary tungsten metal layer 21 superjacent the polysilicon layer 14. The preliminary tungsten layer 21 is deposited via chemical vapor deposition by reacting $WF_6$ with $SiH_4$ at a pressure 4.5 torr, at a temperature of 450° C. for a period of 20 seconds. Although chemical vapor deposition of tungsten metal is considered the preferred method of deposition, other methods such as reactive sputtering are also contemplated and should be considered covered within the scope of this invention. However, prior to the tungsten deposition step, native oxide is removed in-situ from the upper surface of the polysilicon layer 14 with a fluorine-based plasma etch or a hydrogen-based plasma etch. Optionally, but less desirably, the native oxide oxide is removed with an HF dip shortly before the tungsten deposition.

Figure 3:
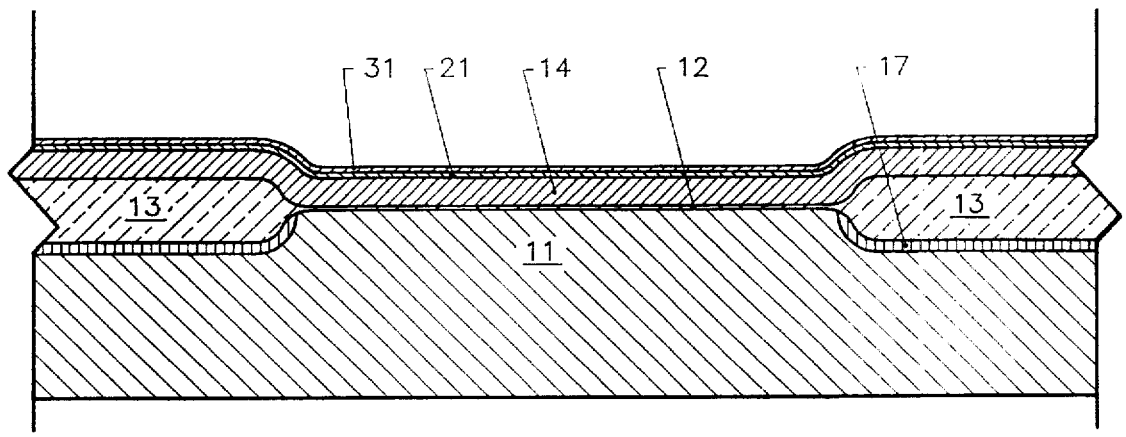
FIG. 3 is a cross-sectional view of the semiconductor substrate portion of FIG. 2 following in-situ treatment with a plasma formed from $NH_3$ and $N_2$ gases to form a tungsten nitride layer on the upper surface of the preliminary tungsten layer.

As shown in FIG. 3, the preliminary tungsten metal layer 21 is treated in-situ (i.e., in the same chamber or in a multiple-chamber system without reexposing the wafer to the exterior ambient atmosphere) with a plasma formed from $NH_3$ and $N_2$ gases for a period of 60–120 seconds at 5 torr and 425° C. This plasma treatment forms a tungsten nitride layer 31 on the upper surface of the preliminary tungsten metal layer 21.

Figure 4:
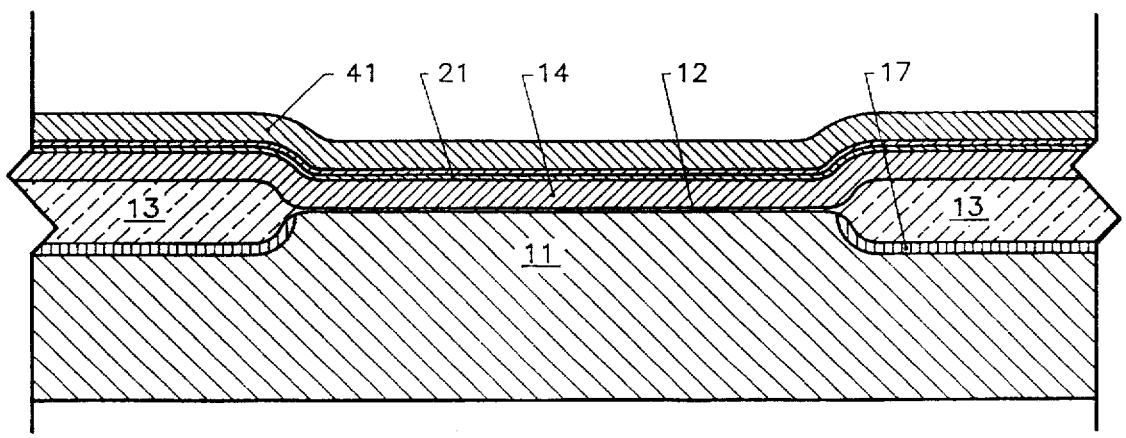
FIG. 4 is a cross-sectional view of the semiconductor substrate portion of FIG. 3 following an additional deposition step to form a final tungsten metal layer superjacent the tungsten nitride barrier layer.

As shown in FIG. 4, a subsequent deposition step has formed a final tungsten metal layer 41 which overlies the tungsten nitride layer 31. Once again, although the tungsten is preferably deposited via chemical vapor deposition by reacting $WF_6$ with $SiH_4$ for 60 seconds under the same conditions as those employed for the deposition of the preliminary tungsten metal layer 21, deposition via other methods is also contemplated. The tungsten nitride layer 31 apparently functions as a barrier layer which prevents the upward diffusion of silicon atoms from the polysilicon layer 14. Formation of tungsten silicide in the final tungsten metal layer 41 is thus prevented. It should be noted that the thickness of preliminary tungsten metal layer 21 need be only sufficient to form an adequate barrier following plasma treatment. Although experiments used to demonstrate the feasibility of this invention utilized a final tungsten metal layer having a thickness approximately four times that of the initially-deposited preliminary tungsten metal layer, even thinner preliminary tungsten metal layers may form an adequate barrier with plasma treatment.

Figure 5:
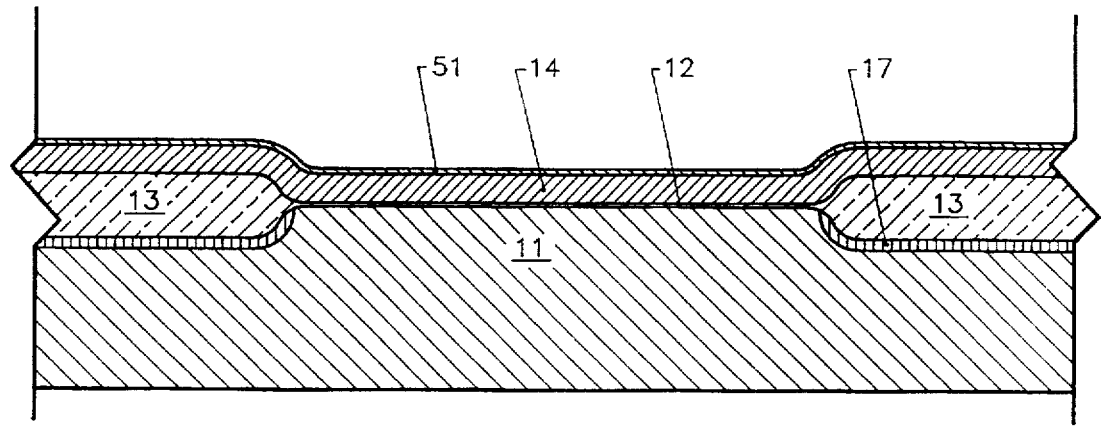
FIG. 5 is a cross-sectional view of a portion of a semiconductor substrate having both field oxide and gate oxide layer regions on which, in accordance with a second embodiment of the invention, a polysilicon layer and a barrier layer have been deposited in succession.

As shown in FIG. 5, the preliminary tungsten metal layer 21 of the first embodiment is eliminated altogether. After removing the native oxide from the surface of polysilicon layer 14, preferably via a fluorine-based plasma etch, a barrier layer 51 is deposited directly on the upper surface of the polysilicon layer 14, rather than converting the already-deposited preliminary tungsten metal layer 21 of the first embodiment of the invention to tungsten nitride. The barrier layer may be deposited via chemical vapor deposition or by reactive sputtering. The barrier layer may be tungsten nitride, titanium nitride, titanium carbonitride, or any other material that is impermeable to silicon atom diffusion, is compatible with a polysilicon/tungsten interface, and is not degraded by semiconductor processing. Several examples of barrier layers in accordance with this embodiment of the invention will now be described.

Deposition of either titanium nitride or tungsten nitride utilizing reactive sputtering is well known in the art, and either material may be used as a barrier layer to prevent the upward diffusion of silicon atoms from the polysilicon layer 14 into a superjacent tungsten metal layer.

Additionally, a titanium nitride barrier layer containing carbon impurities may be deposited by via low-pressure chemical vapor deposition (LPCVD). Although the compound may be referred to as titanium carbonitride (represented by the chemical formula $TiC_xN_y$), the stoichiometry of the compound is variable, depending on the conditions under which it is deposited. Typically, the ratio of nitrogen atoms to carbon atoms in the film falling within a range of 5:1 to 10:1. The deposited films demonstrate excellent step coverage, a high degree of conformality, and an acceptable level of resistivity. Because the films have an amorphous structure (i.e., having no definite crystalline structure), they act as excellent barriers to the migration of ions or atoms from a metal layer on one side of the barrier layer to a semiconductor layer on the other side thereof. The deposition process takes place in a low-pressure chamber (i.e., a chamber in which pressure has been reduced to less than 100 torr prior to deposition), and utilizes one or more of a family of organometallic compounds known generically as tetrakis-dialkylamido-titanium as the sole precursor. Any noble gas, as well as nitrogen or hydrogen, or a mixture of two or more of the foregoing may be used as a carrier for the precursor. The wafer is heated to a temperature within a range of 200°–600° C. Precursor molecules which contact the heated wafer are pyrolyzed to form titanium nitride containing variable amounts of carbon impurities, which deposits as a highly conformal film on the wafer. The carbon impurities affect the characteristics of the film in at least two ways. On the positive side, the incorporation of carbon into the deposited film prevents formation of a crystal structure within the film. On the negative side, the carbon dramatically raises the resistivity of the film. However, this increase in resistivity is relatively insignificant due to the characteristic thinness of the barrier layer required. The carbon content of the barrier film may be minimized by utilizing tetrakis-dimethylamido-titanium, $Ti(NMe_2)_4$, as the precursor, rather than compounds such as tetrakis-diethylamido-titanium or tetrakis-dibutylamido-titanium, which contain a higher percentage of carbon by weight. The carbon content of the barrier film may be further minimized by performing a rapid thermal anneal step in the presence of ammonia. Another method for reducing carbon content is to perform multiple depositions of thin titanium carbonitride layers and perform a plasma treatment between each one using either ammonia or nitrogen gas alone or a combination of both. The preferred conditions for the plasma treatment are deemed to be a chamber pressure of about 5 torr, a total gas flow of 300 sccm (ammonia or nitrogen alone, or the sum of both), a temperature of 425° C. and 600 watts of RF power.

As another example, a tungsten nitride barrier layer may be deposited via plasma chemical vapor deposition (PCVD) using a combination of either $WF_6$ and $N_2$ or $WF_6$ and $NH_3$.

Figure 6:
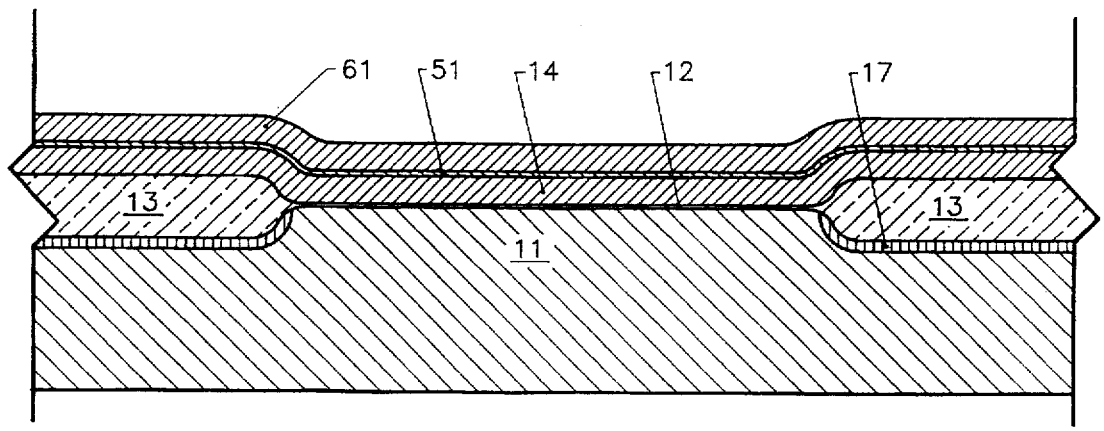
FIG. 6 is a cross-sectional view of the semiconductor substrate portion of FIG. 5 following the deposition of a final tungsten metal layer on top of the barrier layer.

As shown in FIG. 6, a final tungsten metal layer 61 is deposited superjacent the barrier layer 51. The tungsten layer 61 is deposited via chemical vapor deposition by reacting $WF_6$ with $SiH_4$ at a pressure 4.5 torr, at a temperature of 450° C. for a period of 20 seconds. Although chemical vapor deposition of tungsten metal is considered the preferred method of deposition, other methods such as reactive sputtering are also contemplated and should be considered covered within the scope of this invention.

Although only several embodiments of the invention have been described herein, it will be obvious to those having ordinary skill in the art of integrated circuit manufacture that modifications and changes may be made thereto without departing from the scope and the spirit of the invention as hereinafter claimed.

I claim:
1. A process for forming a tungsten metal layer on a polycrystalline silicon surface, said process comprising the steps of:

depositing a preliminary tungsten metal layer on said silicon surface;

converting at least a portion of said preliminary tungsten metal layer to a tungsten nitride barrier layer, said barrier layer being impermeable to mobile silicon atoms of said polycrystalline silicon surface; and depositing a final tungsten metal layer which completely covers said barrier layer.

2. The process of claim 1, wherein a native silicon dioxide layer has formed on the polycrystalline silicon surface and the native silicon dioxide is removed from said surface prior to the formation of the barrier layer.

3. The process of claim 1, wherein said preliminary tungsten layer is subjected to a plasma formed from $NH_3$ and $N_2$ gases in order to convert at least a portion of preliminary tungsten layer to tungsten nitride.

4. The process of claim 1, wherein said preliminary tungsten metal layer is thinner than said final tungsten metal layer.

5. The process of claim 1, wherein said preliminary tungsten metal layer and said final tungsten layer are deposited via chemical vapor deposition.

6. The process of claim 1, wherein said preliminary tungsten metal layer and said final tungsten layer are deposited via reactive sputtering.

7. A process for forming a tungsten metal layer on a polycrystalline silicon surface, said process comprising the steps of:

depositing a metal nitride barrier layer covering said surface via plasma chemical vapor deposition using, as precursor compounds, $WF_6$ and a nitrogen-containing compound selected from the group consisting of $N_2$ and $NH_3$, said barrier layer being impermeable to mobile silicon atoms of said polycrystalline silicon surface; and depositing a tungsten metal layer which completely covers said barrier layer.

8. A process for forming a tungsten metal layer on a polycrystalline silicon layer, said process comprising the steps of:

providing a substrate having a polycrystalline silicon layer deposited thereon, said polycrystalline silicon layer having an exposed surface;

longing a tungsten nitride layer via plasma chemical vapor deposition using, as precursor compounds, $WF_6$ and a nitrogen-containing compound selected from the group consisting of $N_2$ and $NH_3$, said tungsten nitride layer covering said exposed surface, and acting to restrict an upward flow of mobile silicon atoms from said polycrystalline silicon layer; and depositing a tungsten metal layer on top of said tungsten nitride layer.

9. A process for forming a tungsten metal layer on a polycrystalline silicon layer, said process comprising the steps of:

providing a substrate having a polycrystalline silicon layer deposited thereon, said polycrystalline silicon layer having an exposed surface;

forming a titanium carbonitride barrier layer on said exposed surface by pyrolizing an organometallic compound genetically described as tetrakis-dialkylamidotitanium at a temperature within a range of 200° to 600° C. in a chemical vapor deposition chamber in which pressure has been reduced to less than 100 torr;

reducing the carbon content of the deposited barrier film by performing a rapid thermal anneal step in the presence of ammonia; and depositing a tungsten metal layer on top of said barrier layer.

10. A process for forming a tungsten metal layer on a polycrystalline silicon layer, said process comprising the steps of:

providing a substrate having a polycrystalline silicon layer deposited thereon, said polycrystalline silicon layer having an exposed surface;

forming a titanium carbonitride barrier layer on said exposed surface by pyrolizing an organometallic compound generically described as tetrakis-dialkylamido-titanium at a temperature within a range of 200° to 600° C. in a chemical vapor deposition chamber in which pressure has been reduced to less than 100 torr;

reducing the carbon content of the deposited barrier film by subjecting the barrier film to a plasma generated from one or more of the gases selected from the group consisting of nitrogen gas and ammonia gas; and depositing a tungsten metal layer on top of said barrier layer.

11. A process for forming on a silicon substrate partially covered by field isolation regions a conductive sandwich structure from which gate electrodes and interconnect lines can be patterned, said process comprising the steps of:

forming a gate oxide layer on each portion of the substrate not covered by field isolation regions;

depositing a polycrystalline silicon layer which completely covers the field isolation regions and the gate oxide layers, said polycrystalline silicon layer having an upper surface;

forming a barrier layer over the entire upper surface of said polycrystalline silicon layer by depositing a preliminary tungsten metal layer on said upper surface and converting at least a portion of said preliminary tungsten metal layer to tungsten nitride, said barrier layer being impermeable to mobile silicon atoms within said polycrystalline layer; and depositing a final tungsten metal layer which completely covers said barrier layer.

12. The process of claim 11, wherein at least a portion of said preliminary tungsten layer is subjected to a plasma formed from $NH_3$ and $N_2$ gases in order to convert it to tungsten nitride.

13. The process of claim 11, wherein said preliminary tungsten metal layer is thinner than said final tungsten metal layer.

14. The process of claim 11, wherein said preliminary tungsten metal layer and said final tungsten layer are deposited via chemical vapor deposition.

15. A process for forming on a silicon substrate partially covered by field isolation regions a conductive sandwich structure from which gate electrodes and interconnect lines can be patterned, said process comprising the steps of:

forming a gate oxide layer on each portion of the substrate not covered by field isolation regions;

depositing a polycrystalline silicon layer which completely covers the field isolation regions and the gate oxide layers, said polycrystalline silicon layer having an upper surface;

forming a barrier layer on top of the entire upper surface of said polycrystalline silicon layer via chemical vapor deposition, said barrier layer being selected from the group consisting of tungsten nitride, titanium nitride, titanium carbonitride, platinum nitride, palladium nitride, cobalt nitride, molybdenum nitride, nickel nitride, rhodium nitride and iridium nitride, said metal nitride layer being impermeable to mobile silicon atoms within said polycrystalline layer; and depositing a tungsten metal layer which completely covers said barrier layer.

16. The process of claim 15, wherein the chemical vapor deposition step employs $WF_6$ and a nitrogen-containing compound selected from the group consisting of $N_2$ and $NH_3$ as precursor compounds to form a tungsten nitride barrier layer.

17. The process of claim 15, wherein an organometallic compound generically described as tetrakis-dialkylamido-titanium is pyrolized during the chemical vapor deposition step to form a titanium carbonitride barrier layer.

18. The process of claim 17, wherein pyrolization of the organometallic compound takes place within a temperature range of 200° to 600° C., and in a chamber in which pressure has been reduced to less than 100 torr prior to deposition.

19. The process of claim 17, wherein the organometallic compound is tetrakis-dimethylamido-titanium.

* * * * *